(12) United States Patent
Yeo

(10) Patent No.: US 6,543,079 B1
(45) Date of Patent: Apr. 8, 2003

(54) WAFER CLEANING APPARATUS

(75) Inventor: In-jun Yeo, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 207 days.

(21) Appl. No.: 09/612,079

(22) Filed: Jul. 7, 2000

(30) Foreign Application Priority Data

Sep. 27, 1999 (KR) .............................................. 99-41310

(51) Int. Cl.[7] .............................................. A46B 13/02

(52) U.S. Cl. .............................. 15/77; 15/88.2; 15/21.1; 15/102

(58) Field of Search ........................... 15/21.1, 77, 88.2, 15/102

(56) References Cited

U.S. PATENT DOCUMENTS 5,647,083 A * 7/1997 Sugimoto
6,151,744 A * 11/2000 Ohtani
6,286,525 B1 * 9/2001 Nishimura

FOREIGN PATENT DOCUMENTS

KR 962618 1/1996

* cited by examiner

Primary Examiner—Randall E. Chin
(74) Attorney, Agent, or Firm—F. Chau & Associates, LLP

(57) ABSTRACT

A wafer cleaning apparatus for cleaning wafers for manufacturing semiconductor devices is provided. The wafer cleaning apparatus includes a chuck for chucking a wafer to be cleaned, means for rotating the wafer chucked by the chuck, a cleaning solution spray nozzle for spraying a cleaning solution toward the top surface of the wafer rotated by the rotating means, at least two brushes installed to be moved horizontally above the wafer with a predetermined distance spaced apart from the top surface of the wafer in a contact state with the sprayed cleaning solution, and brush moving means for selectively moving the respective brushes horizontally above the wafer, wherein distances between the top surface of the wafer and lower ends of the respective brushes are different from each other when the respective brushes clean the wafer as horizontally moving above the wafer. Therefore, the cost for providing the wafer cleaning apparatus may be reduced because the wafer cleaning apparatus is adapted to clean wafers having layers of various kinds at their topmost layers. Also, the cost and space for installing the wafer cleaning apparatus can be reduced.

8 Claims, 10 Drawing Sheets

WAFER CLEANING APPARATUS

BACKGROUND OF THE INVENTION

1. Field of the Invention

The present invention relates to a wafer cleaning apparatus for cleaning wafers for use in manufacture of semiconductor devices, and more particularly, to an improved wafer cleaning apparatus adapted to clean wafers whose topmost layers are formed from different kinds of layers.

2. Description of the Related Art

One of a semiconductor manufacturing process employed to form a desired circuit pattern includes a step of sequentially stacking a plurality of layers of various kinds (for example, an oxide layer, a polysilicon layer, a nitride layer, metal layer and the like) on a wafer. When foreign particles are interposed between layers in the course of such stacking process, undesirable characteristics may occur. Thus, after forming a predetermined layer on a wafer and before performing a necessary process on the formed layer or stacking another layer thereon, it is necessary to clean the surface of the wafer to remove the foreign particles from the wafer. A wafer to be cleaned may have at its upper portion one or more layers of various types. In other words, a wafer may be provided with only one layer at its upper portion, or be provided with a plurality of layers stacked at the upper portion. In such a wafer, a "topmost surface of a wafer" represents a topmost surface of a topmost layer of the wafer.

A wafer cleaning apparatus, which is so-called a scrubber, is used in cleaning the surface of the wafer. The wafer cleaning apparatus, as shown in FIG. 1, includes a vacuum chuck 2 installed on a frame 1, for vacuum-adsorbing a wafer (W) and chucking the same, a cleaning solution spray nozzle 3 for spraying a cleaning solution such as deionized water toward the top surface of the wafer W chucked on the vacuum chuck 2, an arm 5 rotatable around the axis of a shaft 4 supported on the frame 1, and a brush 6 installed at a free end of the arm 5.

In a state where the wafer W to be cleaned is chucked by the vacuum chuck 2, while the wafer W is rotated by a predetermined rotating means (not shown) and a cleaning solution is sprayed onto the wafer W through the spray nozzle 3, the brush 6 is moved horizontally above the wafer W according to the rotation of the arm 5. Then, foreign particles on the wafer W are swept away by the cleaning solution sprayed onto the rotating wafer W and churned by the brush 6, to then be removed from the wafer W.

While the wafer W is cleaned, if the brush 6 is moved horizontally in contact with the top surface of the wafer W, a layer formed on the wafer W may be scratched by the brush 6, resulting in damage thereto. In other words, in the wafer cleaning process, a distance between a topmost surface (i.e., a topmost surface of a topmost layer) of the wafer and a lower end of the brush 6 should be maintained. If the brush 6 is in contact with the topmost surface of a topmost layer of the wafer, the topmost layer of the wafer may be damaged by the brush. Thus, the brush 6 is spaced apart from the top surface of the wafer W by an appropriate distance to clean the layer without causing any damage. The distance between the brush 6 and the top surface of the wafer W is different depending on the kind of layer facing the brush 6, that is, a topmost layer formed on the wafer W. For example, in the case where the topmost layer on the wafer W is a metal or polysilicon layer, in consideration of the fact that the hardness of the metal or polysilicon layer is high so as not to be easily damaged, it is necessary to make the distance of the brush to the layer small to attain the maximum cleaning effect. The distance between the topmost surface (i.e., the topmost surface of the metal or polysilicon layer) of the wafer and the lower end of the brush may be, for example, less than 0.05 micro meters. Also, in the case where the topmost layer on the wafer W is an oxide layer, which is relatively soft and can be easily damaged, it is necessary to make the distance sufficiently large to the extent that the cleaning effect is ensured. The distance between the topmost surface (i.e., the topmost surface of the oxide layer) of the wafer and the lower end of the brush may be, for example, about 0.1 micro meters. Likewise, in the case where the topmost layer on the wafer W is a polysilicon layer or a nitride layer, the distance must be set in consideration of hardness of each layer and the cleaning effect. The numerical values of the distance may differ depending on, for example, characteristics of a cleaning apparatus.

The distance between the top surface of the wafer W and the lower end of the brush 6 can be changed by adjusting the height at which the brush 6 is installed with respect to the wafer W chucked by the vacuum chuck 2. However, the adjustment of the height of the brush 6 requires much time and endeavors and high cost, in terms of the repeated cleaning operation of sample wafers and the quality test of cleaned sample wafers. Therefore, in the case of cleaning a plurality of wafers having layers of various kinds at their topmost layers, several wafer cleaning apparatuses each of which is dedicated to a specific one of the layers are used in actual manufacturing fields, rather than adjusting the height of the brush 6 according to the kind of the layer formed on the topmost layer of the wafer W. For example, in the case where four layers, such as an oxide layer, a polysilicon layer, a nitride layer and a metal layer, are sequentially stacked on a wafer W, four wafer cleaning apparatuses are provided which are dedicated to the four layers, respectively. A distance between a brush of each wafer cleaning apparatus and the top surface of a wafer to be cleaned by the wafer cleaning apparatus is set in consideration of the hardness of the topmost layer of the wafer.

However, if the number of wafer cleaning apparatuses needed to clean wafers become the same as the number of different layers to be stacked on a wafer, it may be prohibitively costly to prepare many wafer cleaning apparatuses if the wafer has many layers. Also, the time and costs for installing the wafer cleaning apparatuses increases and a wide space is required for the installation of the wafer cleaning apparatuses.

SUMMARY OF THE INVENTION

To solve the above and other problems, it is an objective of the present invention to provide an improved wafer cleaning apparatus which is adapted to clean a plurality of wafers whose topmost layers are different kinds of layers, whereby the cost for providing a wafer cleaning apparatus of the present invention is less than that of a conventional wafer cleaning apparatus, and space required for installing a wafer cleaning apparatus may be reduced.

To accomplish the above objective of the present invention, there is provided a wafer cleaning apparatus includes a chuck for chucking a wafer to be cleaned, means for rotating the wafer chucked by the chuck, a cleaning solution spray nozzle for spraying a cleaning solution toward a surface of the wafer rotated by the rotating means, at least two brushes installed to be moved horizontally above the wafer with a predetermined distance spaced apart from the surface of the wafer in a contact state with the cleaning solution sprayed on the surface of the wafer, and brush moving means for selectively moving the respective brushes horizontally above the wafer, wherein distances between the surface of the wafer and lower ends of the respective brushes are different from each other.

BRIEF DESCRIPTION OF THE DRAWINGS

The above objective and advantages of the present invention will become more apparent by describing in detail preferred embodiments thereof with reference to the attached drawings in which.

DESCRIPTION OF PREFERRED EMBODIMENTS

Preferred embodiments of the present invention will now be described in detail with reference to the accompanying drawings.

Figure 1:
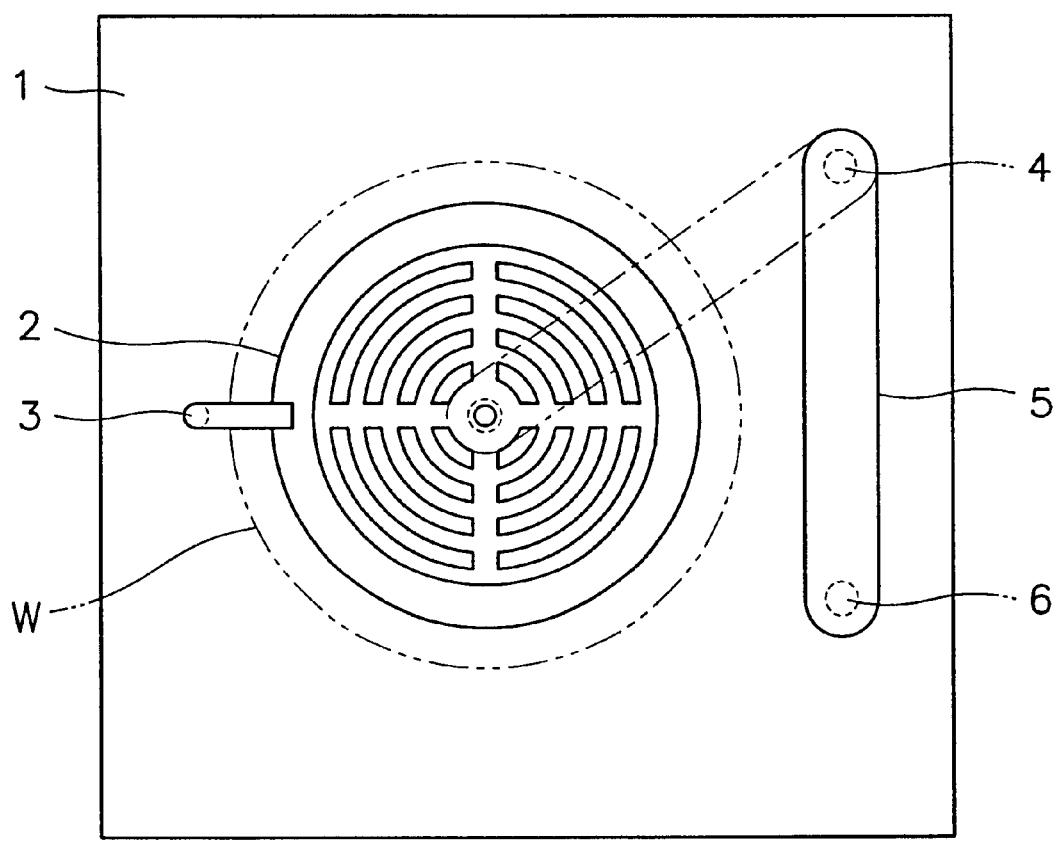
FIG. 1 is a schematic plan view illustrating an exemplary conventional wafer cleaning apparatus.
Figure 2:
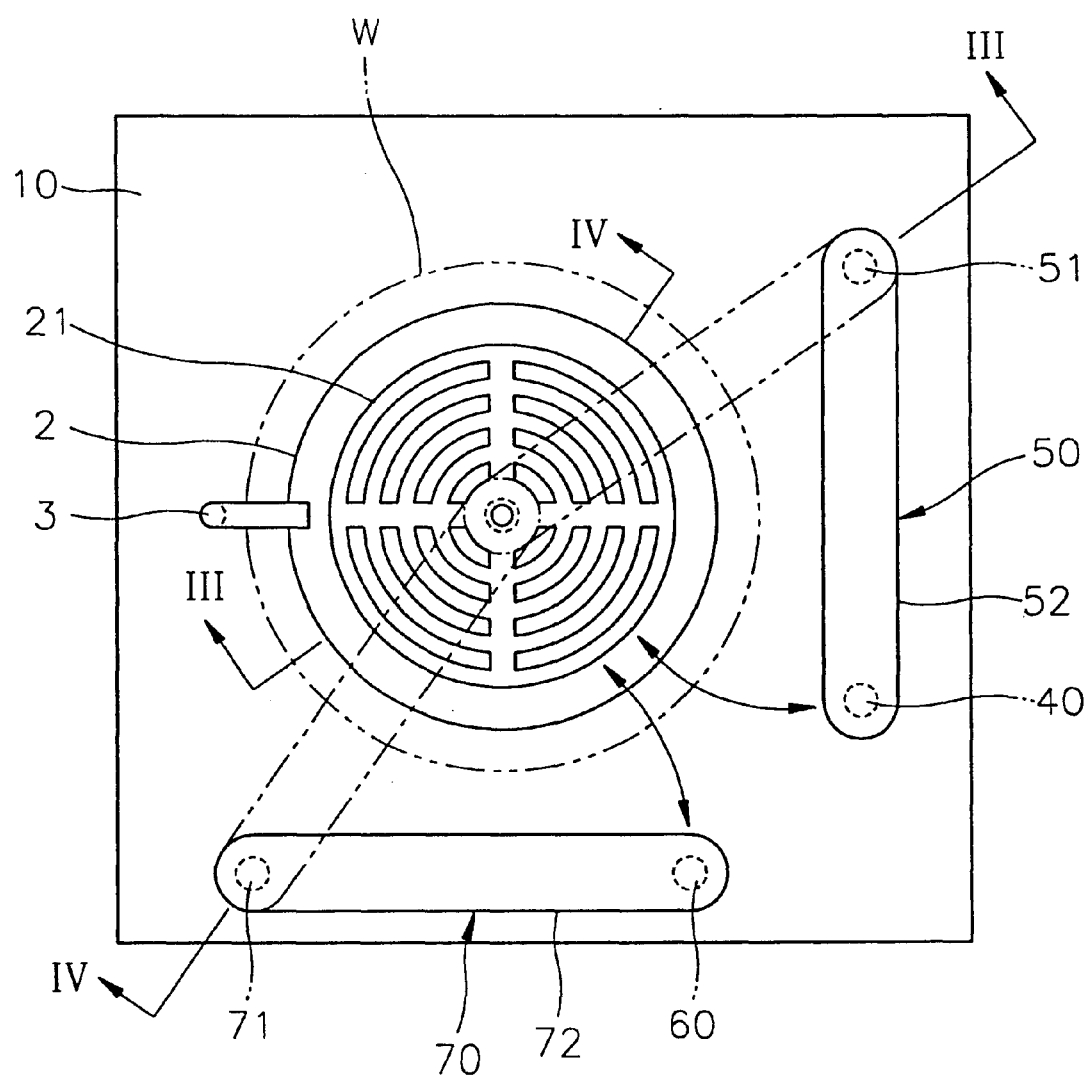
FIG. 2 is a schematic plan view illustrating a wafer cleaning apparatus according to an embodiment of the present invention.
Figure 3:
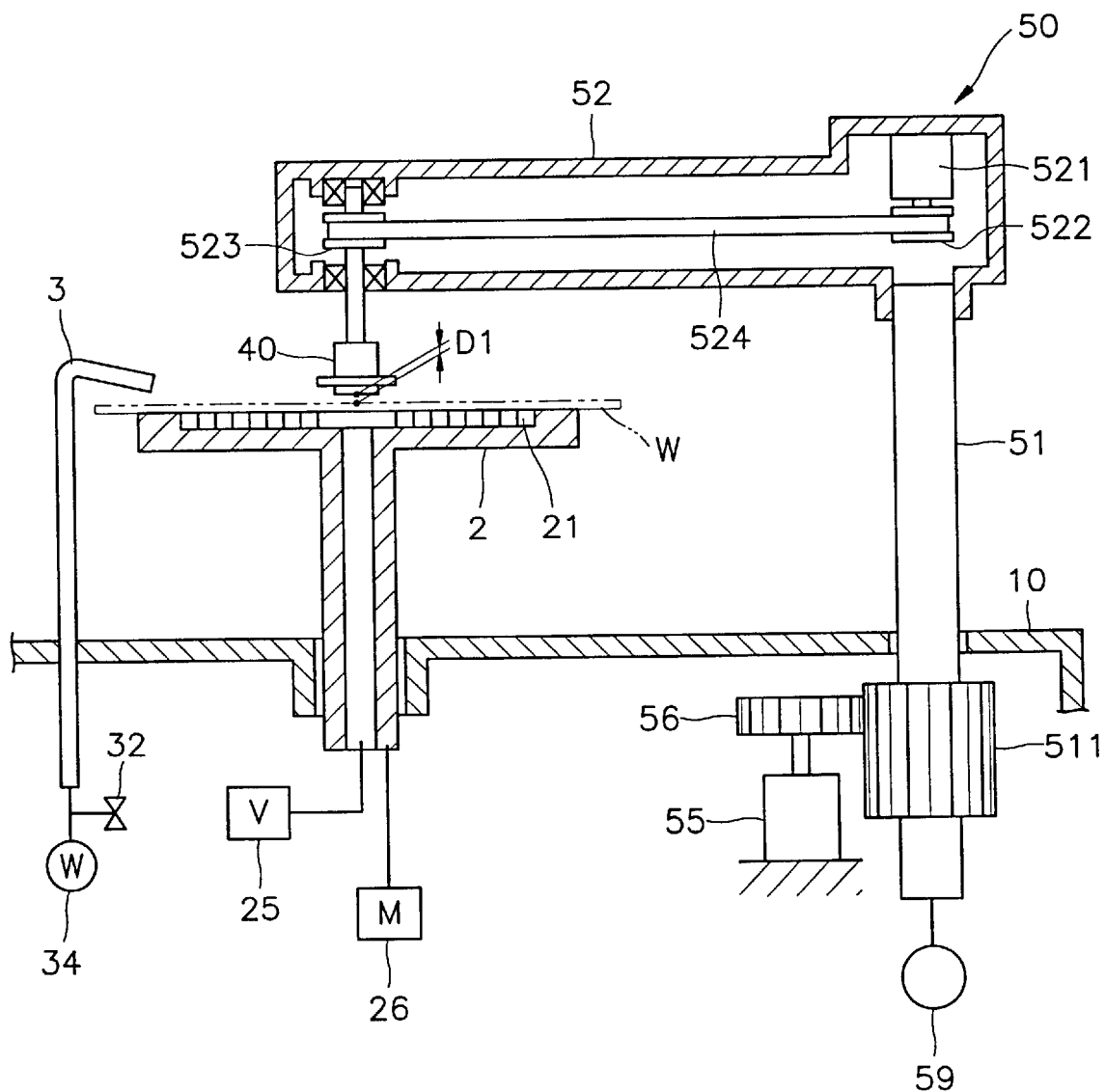
FIG. 3 is a schematic cross-sectional view illustrating the cleaning apparatus shown in FIG. 2, taken along the line III—III.

Referring to FIGS. 2 and 3, a wafer cleaning apparatus according to the present invention includes a chuck 2, a cleaning solution spray nozzle 3 and two brushes 40 and 60.

A slot portion 21 leading to a vacuum pump 25 is formed on the top surface of the chuck 2. A wafer W to be cleaned is placed on the top surface of the chuck 2 to then be chucked thereon by a vacuum pressure of the slot portion 21 when a vacuum state is formed in the slot portion 21 by the vacuum pump 25. The chuck 2 is rotatably installed on a frame 10 so that the chucked wafer W is rotated with respect to the frame 10. A motor 26 mechanically connected to the chuck 2 is provided as rotating means for rotating the wafer W chucked by the chuck 2.

The cleaning solution spray nozzle 3 for spraying a cleaning solution such as deionized water toward the top surface of the chucked wafer W, is connected to a cleaning solution supply source 34 through a valve 32, as shown in FIG. 3.

The respective brushes 40 and 60 can be selectively moved horizontally above the chucked wafer W by brush moving means. In this embodiment, the brush moving means includes a pair of driving units 50 and 70.

One driving unit 50, referred to as a first driving unit, of the pair of driving units 50 and 70, for horizontally moving one brush 40, referred to as a first brush, of the brushes 40 and 60, includes a first support shaft 51, a first arm 52 and a first arm driving motor 55. The first support shaft 51 is vertically installed with respect to the frame 10.

One end of the first arm 52 is fixed to the upper end of the first support shaft 51, and the first brush 40 is rotatably connected to the other end of the first arm 52. The position at which the first brush 40 is connected to the first arm 52 can be suitably set so as to clean a wafer whose topmost layer is, for example, an oxide layer. In other words, the position is set such that when the first brush 40 connected to the first arm 52 is moved horizontally above the wafer W on the chuck 2, a certain length of distance D1 (FIG. 3) between the top surface of the wafer W and the lower end of the first brush 40 is required for effectively cleaning the wafer having, for example, an oxide layer at its topmost layer. A motor 521 for providing a rotational force to the first brush 40 through pulleys 522 and 523 and a belt 524 is installed within the first arm 52.

The first arm driving motor 55 is provided as an actuator for rotating the first arm 52. The rotational force provided by the first arm driving motor 55 is transferred to the first support shaft 51 by a driving gear 56 fixed on the output shaft of the first arm driving motor 55 and a driven gear 511 formed on the first support shaft 51 and geared to the driving gear 56. Thus, when the first arm driving motor 55 operates, the first support shaft 51 rotates. Accordingly, the first arm 52 rotates together with the first support shaft 51 around the axis of the first support shaft 51. In the wafer cleaning apparatus of this embodiment, the first support shaft 51 is installed to be elevated by a driving source 59 such as a pneumatic cylinder. The driven gear 511 is installed at an appropriate height enough to maintain the state in which the driven gear 511 is geared to the driving gear 56 even when the first support shaft 51 is elevated.

Figure 4:
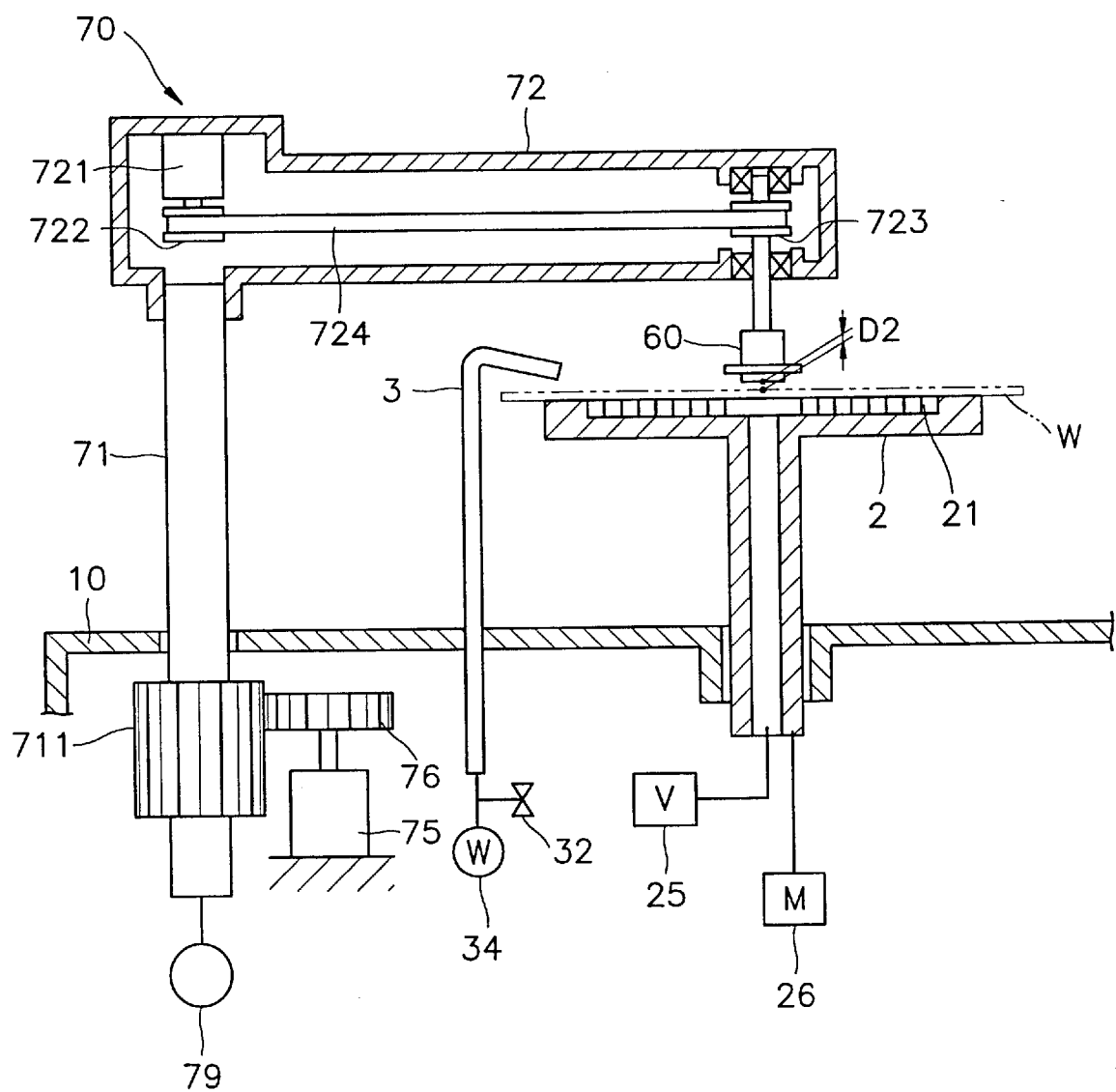
FIG. 4 is a schematic cross-sectional view illustrating the cleaning apparatus shown in FIG. 2, taken along the line IV—IV.

Referring to FIG. 4, the other driving unit 70, referred to as a second driving unit, of the driving units 50 and 70, for horizontally moving another brush 60, referred to as a second brush, of the brushes 40 and 60, includes a second support shaft 71, a second arm 72 and a second arm driving motor 75. The second support shaft 71 is vertically installed with respect to the frame 10.

One end of the second arm 72 is fixed to the upper end of the second support shaft 71, and the second brush 60 is rotatably connected to the other end of the second arm 72. The position at which the second brush 60 is connected to the second arm 72 can be suitably set so as to clean a wafer having, for example, a metal layer as its topmost layer. In other words, the position is set such that when the second brush 60 connected to the second arm 72 is moved horizontally above the wafer W on the chuck 2, a certain length of distance D2 (FIG. 4) between the top surface of the wafer W and the lower end of the second brush 60 is required for effectively cleaning the wafer having, for example, a metal layer at its topmost layer. A motor 721 for providing a rotational force to the second brush 60 through pulleys 722 and 723 and a belt 724 is installed within the second arm 72.

The second arm driving motor 75 is provided as an actuator for rotating the second arm 72. The rotational force provided by the second arm driving motor 75 is transferred to the second support shaft 71 by a driving gear 76 fixed on the output shaft of the second arm driving motor 75 and a driven gear 711 formed on the second support shaft 71 and geared to the driving gear 76. Thus, when the second arm driving motor 75 operates, the second support shaft 71 rotates. Accordingly, the second arm 72 rotates together with the second support shaft 71 around the axis of the second support shaft 71. In the wafer cleaning apparatus of this embodiment, the second support shaft 71 is installed to be elevated by a driving source 79 such as a pneumatic cylinder. The driven gear 711 is installed at an appropriate Height enough to maintain the state in which the driven gear 711 is geared to the driving gear 76 even when the second support shaft 71 is elevated.

In the case where the first brush 40 is positioned at such a height that a wafer having an oxide layer at its topmost layer can be cleaned and the second brush 60 is positioned at such a height that a wafer having a metal layer at its topmost layer can be cleaned, the wafer cleaning apparatus having the aforementioned configuration operates s follows. For convenience sake of explanation, a wafer having an oxide layer at its topmost layer and a wafer having a metal layer at its topmost layer are both defined as reference letter "W".

First, in order to clean the wafer W having an oxide layer at its topmost layer, as shown in FIG. 2, if the wafer W is placed on the chuck 2 and then the air inside the slot portion 21 formed on the top surface of the chuck 2 is exhausted by the vacuum pump 25, the wafer W is chucked on the top surface of the chuck 2 in a vacuum-adsorbed state. If chucking of the wafer W is completed, the motor (26 of FIG. 3) is driven to rotate the chuck 2 and the wafer W chucked by the chuck 2. Then, the valve 32 is opened so that the cleaning solution is sprayed onto the wafer W from the cleaning solution supply source 34 through the cleaning solution spray nozzle 3. Thereafter, the first arm driving motor 55 is driven so that the first support shaft 51 rotates by the driving gear 56 and the driven gear 511. Accordingly, the first arm 52 fixed on the first support shaft 51 is rotated from a position indicated by a solid line in FIG. 2, that is, a standby position, to a position indicated by a solid line in FIG. 5. As a result, the first brush 40 is positioned above the periphery of the wafer W, as indicated by a solid line in FIG. 6.

Figure 6:
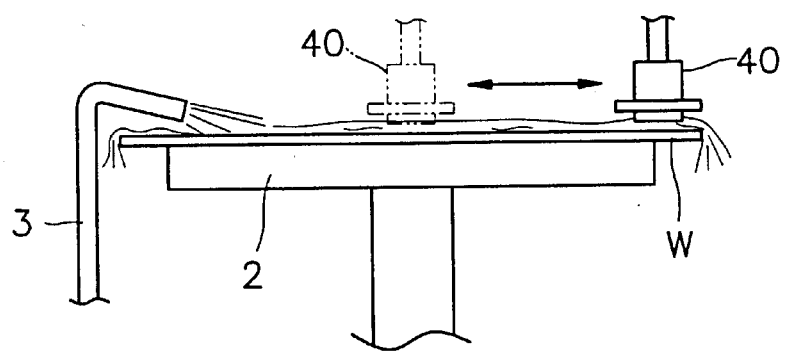
FIG. 6 is a diagram illustrating the first brush shown in FIG. 5, viewed from a direction "A"

In the case where there is interference along the path of the first brush 40 moving above the periphery of the wafer W, in a state where the first arm 52 is at a standby position, as shown in FIG. 2, the first support shaft 51 and the first arm 52 fixed on the first support shaft 51 are lifted by a predetermined height by the driving source (59 of FIG. 3) to then horizontally move the first arm 52 by the first arm driving motor 55, and then the first support shaft 51 and the first arm 52 are lowered by the driving source 59. In such a manner, the first brush 40 can be moved to a position at which the first brush 40 performs cleaning without being interfered, as shown in FIG. 6.

Figure 5:
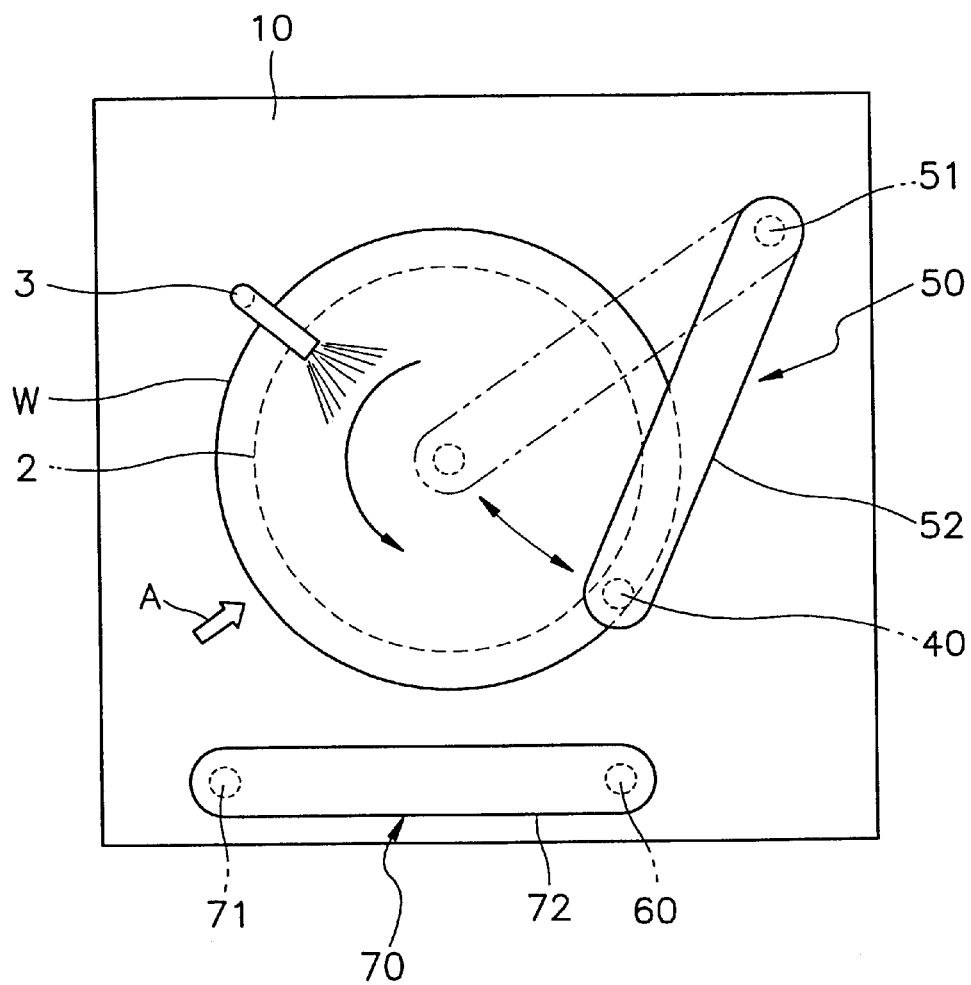
FIG. 5 is a diagram illustrating the state where a first brush shown in FIG. 2 is moved horizontally above a wafer.

Thereafter, the first arm driving motor 55 alternately rotates in opposite directions so that the first arm 52 reciprocates between the position indicated by the solid line and the position indicated by an imaginary line in FIG. 5. Here, while the first brush 40 is moved horizontally with the distance (D1 of FIG. 3) above the rotating wafer W, the cleaning solution sprayed onto the wafer W is swept away so that foreign particles adhered to the top surface of the wafer W are removed from the wafer W. When the first brush 40 cleans the wafer W as horizontally moving above the wafer W, the motor (521 of FIG. 3) in the first arm 52 may be driven to rotate the first brush 40 with respect to the first arm 52, thereby promoting the cleaning effect. As described above, while the wafer W is cleaned by the first brush 40, the second arm 72 and the second brush 60 are positioned at a standby position, that is, at a position being away from the above of the wafer W, as shown in FIG. 5.

If cleaning of the wafer W is completed, the first arm 52 is rotated by the first arm driving motor 55 to then be positioned at a standby position, as indicated by the solid line in FIG. 2, so as to draw out the cleaned wafer W from the chuck 2. Then, if a new wafer W having an oxide layer at its topmost layer is placed on the chuck 2 to be chucked, the new wafer W is cleaned by the above-described cleaning process.

In the case where a wafer W having a metal layer at its topmost layer must be cleaned in the course of continuously cleaning wafers W having oxide layers at their topmost layers in the abovedescribed manner, a cleaning solution is sprayed onto the wafer W having the metal layer through the cleaning solution spray nozzle 3 while the wafer W is chucked by the chuck 2 to then be rotated. The chucking and rotation of the wafer having the metal layer and the spraying of the cleaning solution are the same as those above described for the wafers having the oxide layer, and a detailed explanation will be omitted.

Figure 7:
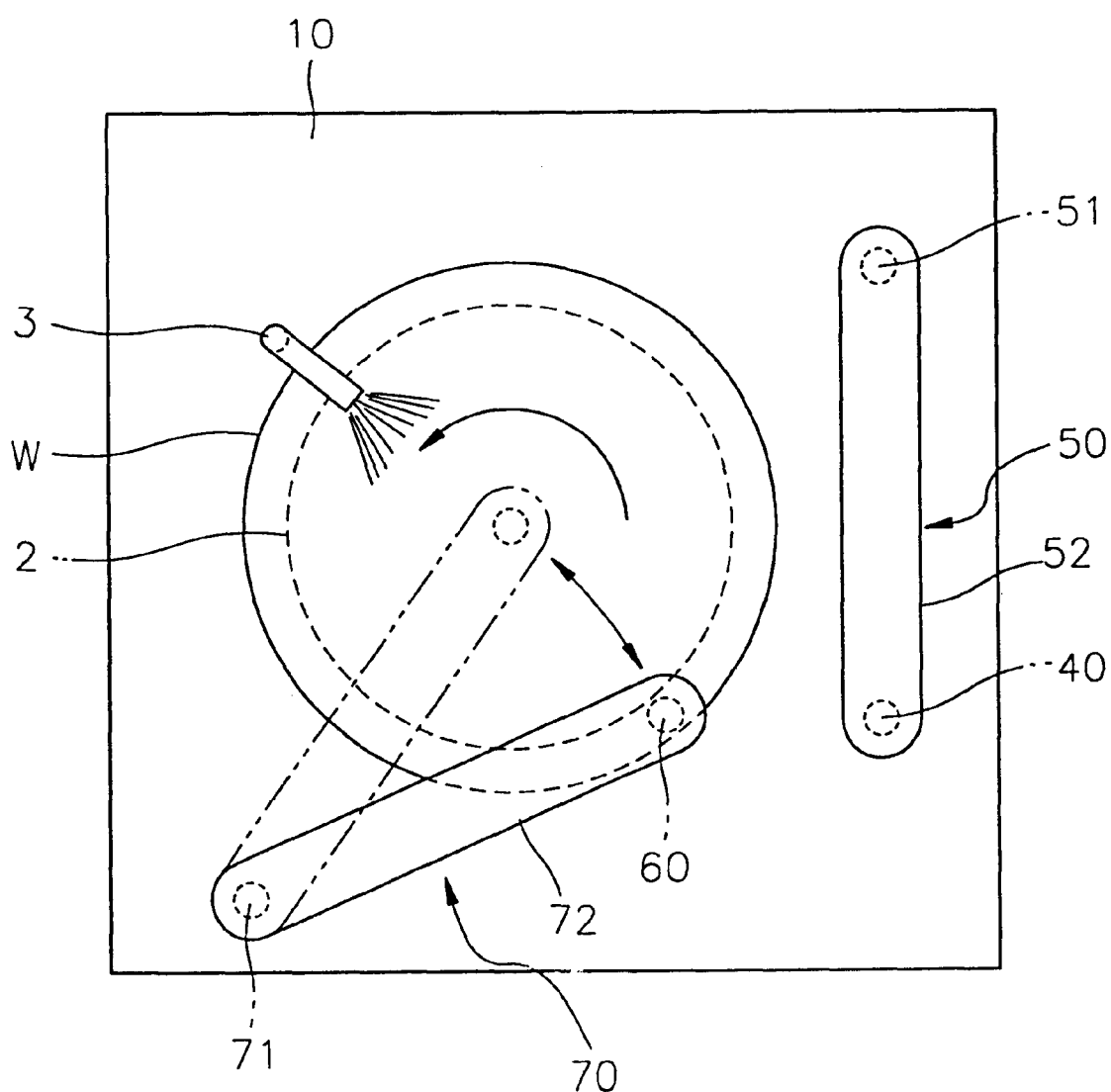
FIG. 7 is a diagram illustrating the state where a second brush shown in FIG. 2 is moved horizontally above a wafer.

Thereafter, the second arm driving motor 75 is driven and the rotational force of the second arm driving motor 75 is transferred to the second support shaft 71 through the driving gear 76 and the driven gear 711 so that the second arm 72 fixed on the second support shaft 71 is rotated from a position indicated by a solid line in FIG. 2, that is, a standby position, to a position indicated by a solid line in FIG. 7. As a result, the second brush 60 is positioned above the periphery of the wafer W.

In the case where there is interference along the path of the second brush 60 moving horizontally above the periphery of the wafer W, in a state where the second arm 72 is at a standby position, as shown in FIG. 2, the second support shaft 71 and the second arm 72 fixed on the second support shaft 71 are lifted by a predetermined height by the driving source (79 of FIG. 4) to then horizontally move the second arm 72 by the second arm driving motor 75, and then the second support shaft 71 and the second arm 72 are lowered by the driving source 79. In such a manner, the second brush 60 can be moved to a position at which the second brush 60 performs cleaning without being interfered.

Thereafter, the second arm driving motor 75 alternately rotates in opposite directions so that the second arm 72 reciprocates between the position indicated by the solid line and the position indicated by an imaginary line in FIG. 7. Then, the second brush 60 is moved horizontally with the distance (D2 of FIG. 4) spaced apart above the rotating wafer W. In the course of doing so, the cleaning solution sprayed onto the wafer W is swept away so that foreign particles adhered to the top surface of the wafer W are removed from the wafer W. When the second brush 60 cleans the wafer W as horizontally moving above the wafer W, the motor (721 of FIG. 4) in the second arm 72 may be driven to rotate the second brush 60 with respect to the second arm 72, thereby promoting the cleaning effect. While the wafer W is cleaned by the second brush 60, the first arm 52 and the first brush 40 are positioned at a standby position, that is, at a position being away from the above of the wafer W, as shown in FIG. 7.

If cleaning of the wafer W having the metal layer at its topmost layer is completed, the second arm 72 is rotated by the second arm driving motor 75 to then be positioned at a standby position, as indicated by the solid line in FIG. 2, so as to draw out the cleaned wafer W from the chuck 2. Then, the second arm 72 is at the standby position for cleaning a new wafer having a metal layer at its topmost layer.

As described above, according to the wafer cleaning apparatus of this embodiment, two brushes 40 and 60 capable of selectively cleaning two kinds of wafers W having different layers at their topmost layers, are provided. Thus, compared to the conventional case in which two separate wafer cleaning apparatuses for cleaning two kinds of wafers W are provided, the overall manufacturing cost of the wafer cleaning apparatus can be reduced. Also, the cost and space for installing the wafer cleaning apparatus can be reduced.

Figure 8:
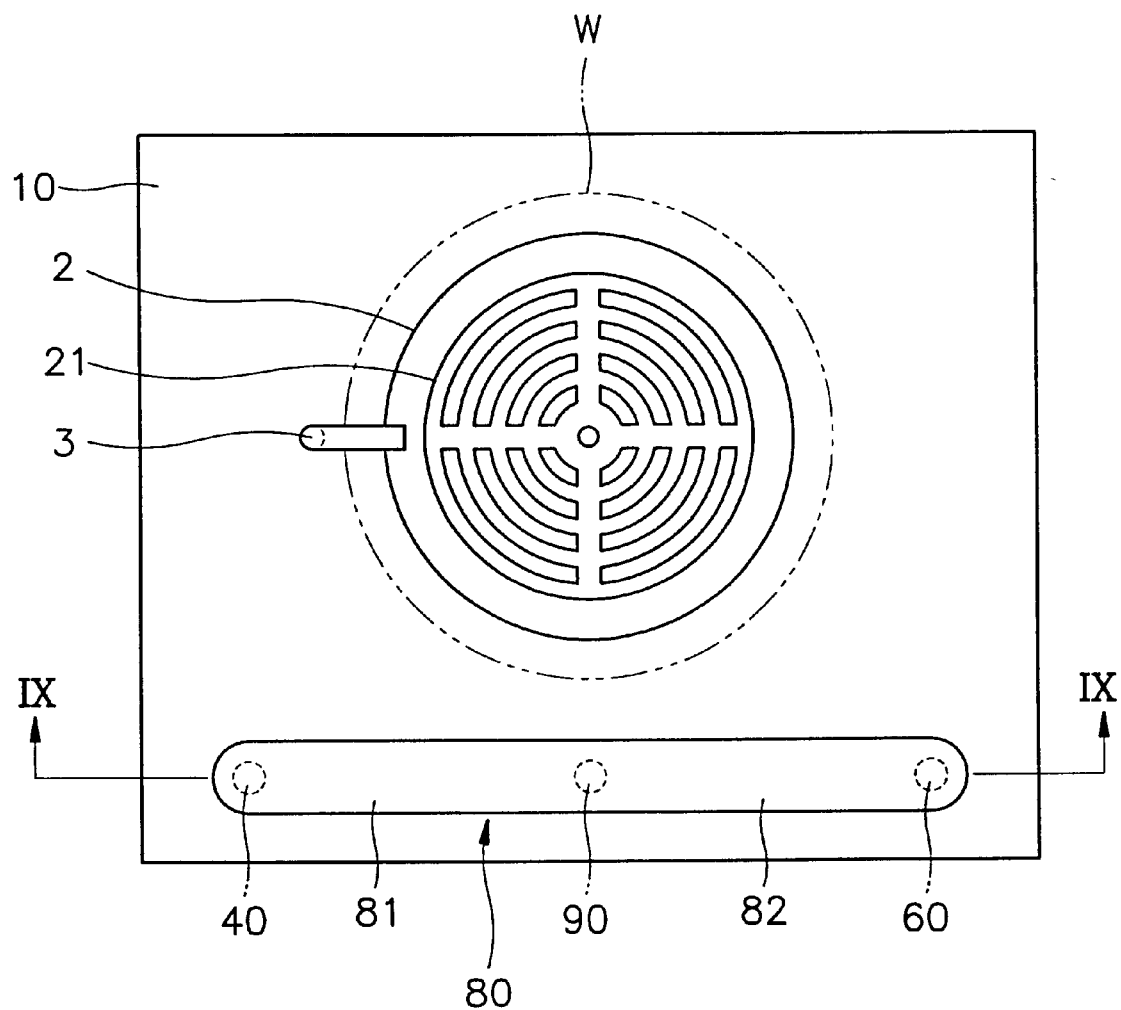
FIG. 8 is a schematic plan view illustrating a wafer cleaning apparatus according to another embodiment of the present invention.
Figure 9:
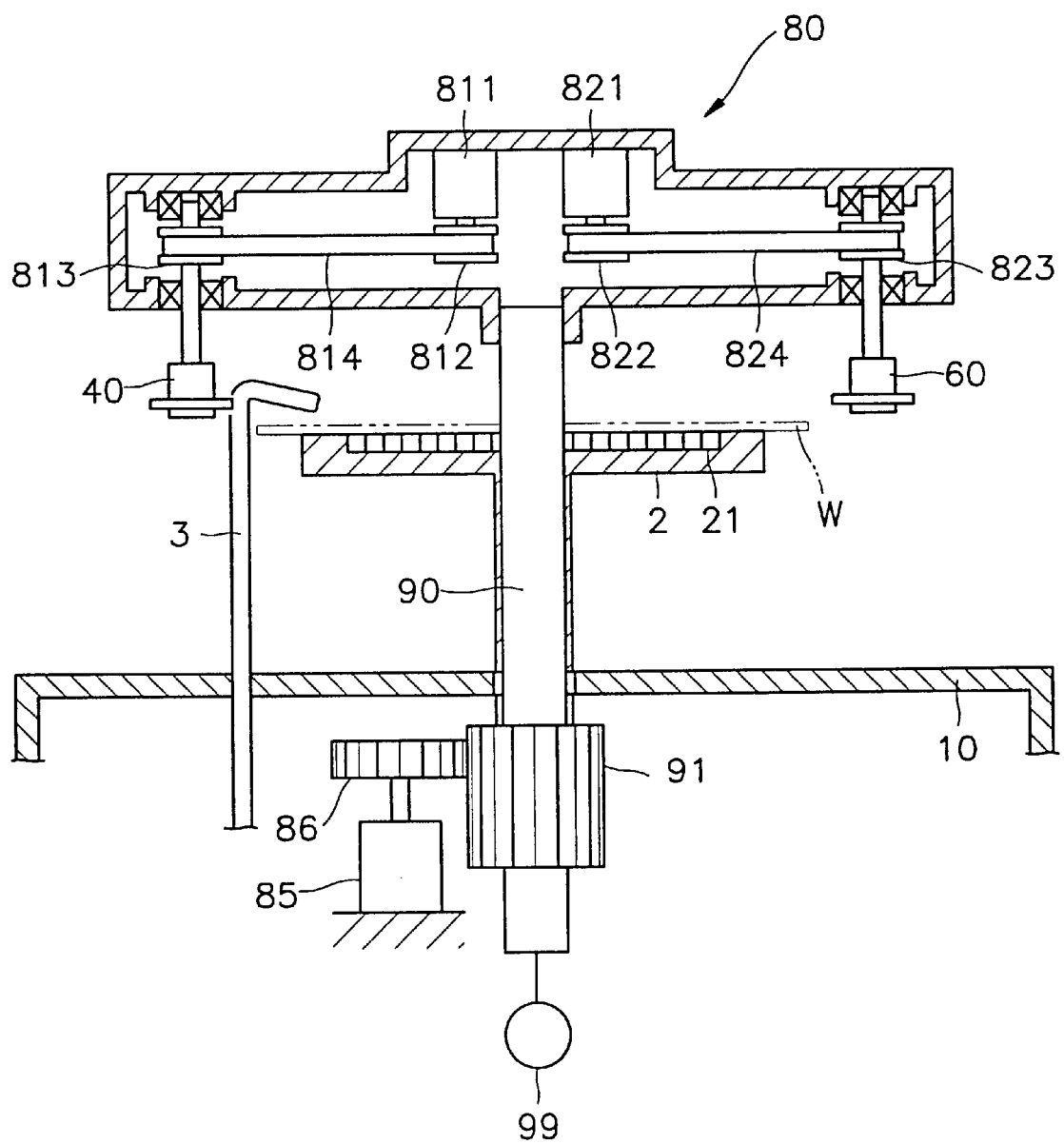
FIG. 9 is a schematic cross-sectional view illustrating the cleaning apparatus shown in FIG. 8, taken along the line IX—IX.

FIG. 8 is a schematic plan view illustrating a wafer cleaning apparatus according to another embodiment of the present invention.

The wafer cleaning apparatus of this embodiment is the same as the wafer cleaning apparatus according to the first embodiment of the present invention which has been described with reference to FIGS. 2 through 7 with respect to the chuck 2, the cleaning solution spray nozzle 3 and the first and second brushes 40 and 60, but is different in terms of the construction of brush moving means for selectively moving two brushes 40 and 60 horizontally above a wafer W.

The brush moving means in the wafer cleaning apparatus of this embodiment includes a support shaft 90 disposed vertically with respect to the frame 10, an arm 80 coupled to the support shaft 90, and an arm driving motor 85 for rotating the arm 80.

The arm 80 includes a central part fixed on the support shaft 90 and a pair of supporting parts 81 and 82 extending in opposite directions from the central part. A first brush 40 is rotatably coupled to one end of a supporting part 81, referred to as a first supporting part, of the pair of supporting parts 81 and 82, and a second brush 60 is rotatably coupled to the other end of another supporting part 82, referred to as a second supporting part.

Like in the wafer cleaning apparatus of the first embodiment described with reference to FIGS. 2 through 7, in the wafer cleaning apparatus of this embodiment, when the first brush 40 is moved horizontally above the wafer W, a distance which is appropriate for cleaning the wafer having, for example, an oxide layer at its topmost layer is maintained between the top surface of the wafer W and the lower end of the first brush 40. Also, when the second brush 60 is moved horizontally above the wafer W, a distance different from the distance between the first brush 40 and the wafer W, which is appropriate for cleaning the wafer having, for example, a metal layer at its topmost layer, is maintained between the top surface of the wafer W and the lower end of the second brush 60.

A motor 811 for providing a rotational force to the first brush 40 through pulleys 812 and 813 and a belt 814, and a motor 821 for providing a rotational force to the second brush 60 through pulleys 822 and 823 and a belt 824, are installed within the arm 80.

The arm driving motor 85 is provided as an actuator for rotating the arm 80 around the axis of the support shaft 90 so that one of the brushes 40 and 60 is selectively moved horizontally above the wafer W. In order to transfer the rotational force provided by the arm driving motor 85 to the arm 80, a driving gear 86 is fixed on the output shaft of the arm driving motor 85 and a driven gear 91 geared to the driving gear 86 is formed on the support shaft 90. The support shaft 90 can be elevated by a driving source 99 such as a pneumatic cylinder. The driven gear 91 is installed at an appropriate height enough to maintain the state in which the driven gear 91 is geared to the driving gear 86 even when the support shaft 90 is elevated.

Like in the wafer cleaning apparatus of the first embodiment described with reference to FIGS. 2 through 7, in the wafer cleaning apparatus of this embodiment, a wafer W to be clean is chucked on the chuck 2 by the vacuum pump 25. Also, the wafer W is rotated by rotating the chuck 2 by the motor 26. When the valve 32 is opened, the cleaning solution is sprayed onto the wafer W from the cleaning solution supply source 34 through the cleaning solution spray nozzle 3.

In such a state, in the case where the chucked wafer W has an oxide layer at its topmost layer, the arm driving motor 85 is driven so that the support shaft 90 and the arm 80 fixed on the support shaft 90 are rotated. Accordingly, the first brush 40 positioned at a standby position, as shown in FIG. 8, is moved above the periphery of the wafer W chucked on the chuck 2, as indicated by a solid line in FIG. 10.

Figure 10:
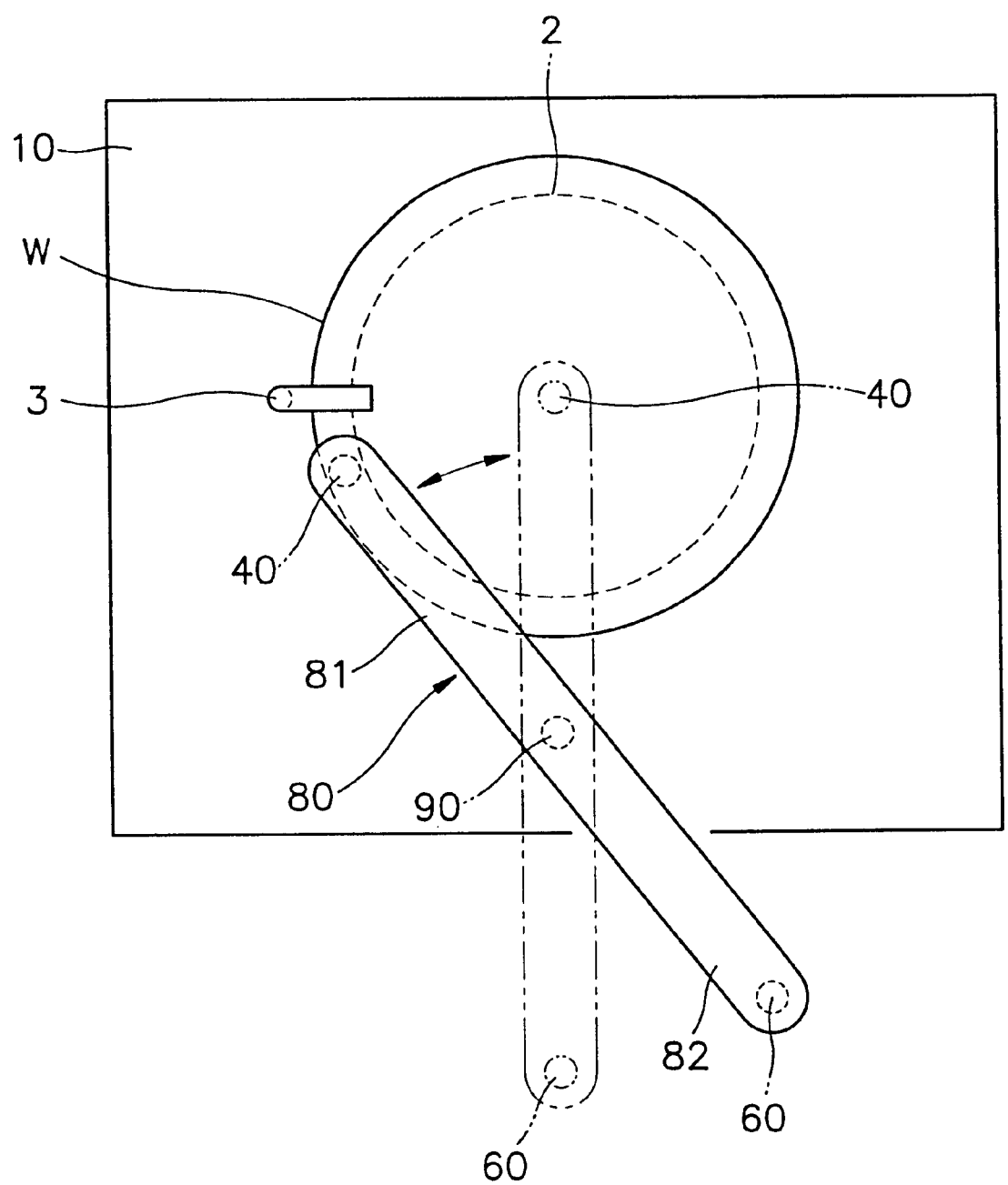
FIG. 10 is a diagram illustrating the state where a first brush shown in FIG. 8 is moved horizontally above a wafer.

Thereafter, the arm 80 is reciprocated between the position indicated by the solid line and the position indicated by an imaginary line in FIG. 10 by the arm driving motor 85. Then, the first brush 40 is moved horizontally above the rotating wafer W with an appropriate distance maintained from the wafer W, so that the cleaning solution sprayed onto the wafer W is swept away. Accordingly, foreign particles adhered to the top surface of the wafer W are removed from the wafer W. The cleaning effect can be further improved by rotating the first brush 40 with respect to the arm 80 by the motor 811 while the first brush 40 is horizontally moved above the wafer W, as described above.

While the wafer W is cleaned by the first brush 40, the second supporting part 82 and the second brush 60 are positioned at a position being away from the above of the wafer W, as shown in FIG. 10. Thus, there is no interference between the wafer W having the oxide layer at its topmost layer and the second brush 60.

If cleaning is completed, the arm 80 is rotated to then be positioned at a standby position, as indicated by the solid line in FIG. 8, so as to draw out the cleaned wafer W from the chuck 2 without being interfered.

In the case where a wafer W having a metal layer at its topmost layer must be cleaned in the course of continuously cleaning wafers W having oxide layers at their topmost layers by repeating the above-described process, a cleaning solution is sprayed onto the wafer W having a metal layer as its topmost layer while the wafer W is chucked by the chuck 2 to then be rotated. Also, the arm driving motor 85 is driven to rotate the arm 80 so that the second brush 60 is positioned above the periphery of the wafer W chucked on the chuck 2, as indicated by a solid line in FIG. 11. Then, the arm driving motor 85 alternately rotates in opposite directions to reciprocate the arm 80 between the position indicated by the solid line and the position indicated by the imaginary line in FIG. 11. Then, the second brush 60 is moved horizontally above the rotating wafer W, maintaining the distance set between the second brush 60 and the rotating wafer W. Thus, the cleaning solution sprayed onto the wafer W is swept away so that foreign particles adhered to the top surface of the wafer W are removed from the wafer W.

Figure 11:
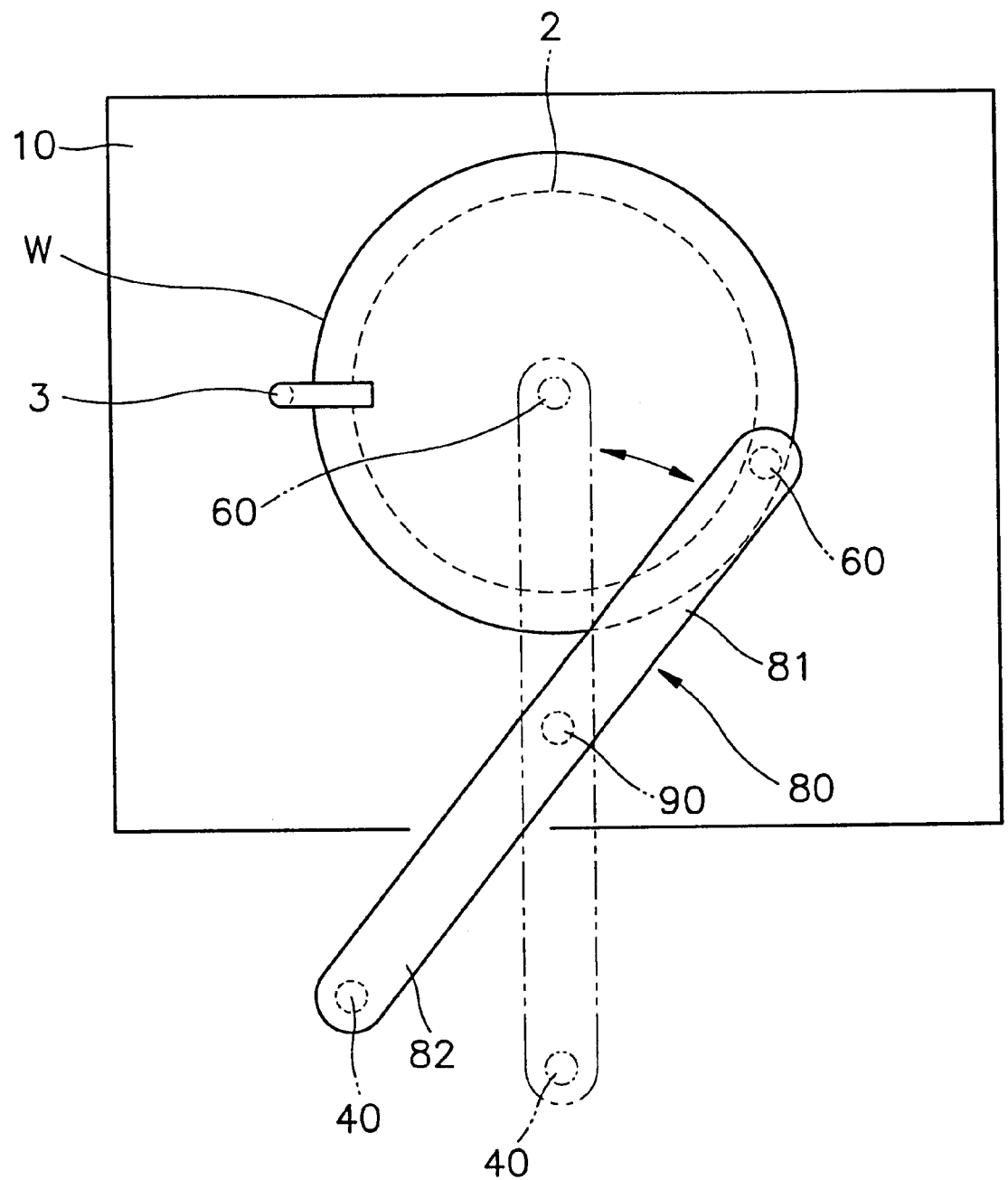
FIG. 11 is a diagram illustrating the state where a second brush shown in FIG. 8 is moved horizontally above a wafer.

When the second brush 60 cleans the wafer W as horizontally moving above the wafer W, the second brush 60 is rotated with respect to the arm 80 by the motor 821, thereby promoting the cleaning effect. While the wafer W is cleaned by the second brush 60, the first brush 40 coupled to the first supporting part 81 is positioned at a position being away from the above of the wafer W, as shown in FIG. 11. Thus, there is no interference between the wafer W having a metal layer at its topmost layer and the first brush 40.

If cleaning of the wafer W is completed, the arm 80 is rotated to then be positioned at a standby position, that is at a position being away from the above of the wafer W, as indicated in FIG. 8, so as to draw out the cleaned wafer W from the chuck 2 without being interfered.

If the first brush 40 or the second brush 60 is to be moved horizontally above the periphery of the wafer W chucked by the chuck 2 from the standby position shown in FIG. 8, the first brush 40 or the second brush 60 may be positioned at a cleaning position such that the support shaft 90 and the arm 80 fixed on the support shaft 90 are lifted by a predetermined height by the driving source 99 such as a pneumatic cylinder, the first brush 40 or the second brush 60 is moved horizontally above the periphery of the wafer W by the arm driving motor 85 and then the support shaft 90 and the arm 80 are lowered by the driving source 99.

Like in the wafer cleaning apparatus according to the first embodiment, in the wafer cleaning apparatus of this embodiment, two wafers W having different kinds of layers at their topmost layers are selectively cleaned using two brushes 40 and 60. Thus, the overall manufacturing cost of the wafer cleaning apparatus for cleaning two wafers W can be reduced. Also, the cost and space for installing the wafer cleaning apparatus can be reduced.

Although it has been described and illustrated that two brushes are provided in the present invention, the invention is not limited thereto. A wafer cleaning apparatus having three, four or more brushes and brush moving means for selectively moving horizontally the brushes above a wafer may also be attained by the present invention.

Also, it has been described through the preferred embodiments that a driving source for elevating an arm is provided in consideration of a possibility that a brush is interfered by predetermined interference when the brush is moved horizontally from a standby position to the above of the periphery of a wafer chucked by a chuck. However, in the case where there is no interference, the driving source is not necessarily provided.

Further, it has been described through the preferred embodiments that a brush is rotatably supported with respect to an arm and a motor for rotating the brush is provided. However, it is also possible that a brush does not rotate with respect to an arm.

Also, although it has been described through the preferred embodiments that an arm is supported on a support shaft and is rotated according to the rotation of the support shaft, a brush may be rotatably coupled to the support shaft, with the support shaft being fixed on a frame, to then rotate the arm around the axis of the support shaft.

While the present invention has been described by way of examples, it should be apparent to those skilled in the art that many modified wafer cleaning apparatuses may be embodied without departing from the spirit and scope of the invention as defined in the claims.

Advantageously, the cost for providing the wafer cleaning apparatus of the present invention may be reduced because the wafer cleaning apparatus is adapted to be capable of cleaning a plurality of wafers having layers of various kinds at their topmost layers. Also, the cost and space for installing the wafer cleaning apparatus can be reduced.

What is claimed is:

1. A wafer cleaning apparatus comprising:
   a chuck for chucking a wafer to be cleaned;
   means for rotating the wafer chucked by the chuck;
   a cleaning solution spray nozzle for spraying a cleaning solution toward a topmost surface of the wafer rotated by said means for rotating;
   at least two brushes installed to be moved horizontally above the wafer with a predetermined distance spaced apart from the surface of the wafer in a contact state with the cleaning solution sprayed on the surface of the wafer; and
   brush moving means for selectively moving the respective brushes horizontally above the wafer, wherein distances between the topmost surface of the wafer and lower ends of the respective brushes are different from each other.

2. The wafer cleaning apparatus according to claim 1, wherein the brush moving means includes a plurality of driving units, and each driving unit includes a vertically installed support shaft, an arm having two ends, wherein one of the two ends is coupled to the support shaft and the other of the two ends is coupled to one of the at least two brushes, and an actuator for rotating the arm around axis of the support shaft so that the brush is moved horizontally above the wafer.

3. The wafer cleaning apparatus according to claim 2, further comprising a motor installed in said one of the two ends of said arm of said each driving unit for rotating said one of the at least two brushes coupled to said other of the two ends of said arm.

4. The wafer cleaning apparatus according to claim 1, wherein the brush moving means comprises:
   a vertically installed support shaft;
   an arm whose central part is coupled to the support shaft and which has a plurality of supporting parts extending in different directions from the central part, one of the at least two brushes being coupled to corresponding one of the supporting parts; and
   an actuator for rotating the arm around axis of the support shaft so that one of the at least two brushes is selectively moved horizontally above the wafer.

5. The wafer cleaning apparatus according to claim 1, wherein a distance between the topmost surface of the wafer and a lower end of one of the at least two brushes is determined depending on a type of a layer of the topmost surface of the wafer.

6. A wafer cleaning apparatus comprising:
   a chuck for chucking a wafer;
   means for rotating the wafer chucked by the chuck;
   means for providing a cleaning solution on a topmost surface of the wafer;
   a plurality of brushes, each of which cleans the topmost surface of the wafer with the cleaning solution, wherein the topmost surface of the wafer has one of various types of layers thereon, and each of the plurality of brushes is selected to correspond to the type of layer formed on the topmost surface of the wafer; and
   a plurality of brush moving units each of which is associated with corresponding one of the plurality of brushes to move the corresponding brush above the topmost surface of the wafer, wherein the plurality of brush moving units are selectively driven according to a type of a layer of the topmost surface of the wafer.

7. The wafer cleaning apparatus according to claim 6, wherein each of the plurality of brush moving units includes:

a vertically installed support shaft;

an arm having one end coupled to the support shaft and the other end coupled to corresponding one of the plurality of brushes; and an actuator for rotating the arm around axis of the support shaft so that the corresponding one of the plurality of brushes is moved above the wafer.

8. The wafer cleaning apparatus according to claim 6, wherein a distance between the topmost surface of the wafer and a lower end of a brush for cleaning the topmost surface of the wafer is determined depending on a type of a layer of the topmost surface of the wafer.

* * * * *